United States Patent
Lee et al.

(10) Patent No.: US 12,231,794 B2
(45) Date of Patent: Feb. 18, 2025

(54) IMAGE SENSOR WITH SHARED FLOATING DIFFUSION REGION

(71) Applicant: SAMSUNG ELECTRONICS CO., LTD., Suwon-Si (KR)

(72) Inventors: Jun An Lee, Seongnam-Si (KR); Jae Jin Jung, Hwaseong-Si (KR); Soon Ik Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 17/897,253

(22) Filed: Aug. 29, 2022

(65) Prior Publication Data

US 2023/0199346 A1     Jun. 22, 2023

(30) Foreign Application Priority Data

Dec. 21, 2021    (KR) .................... 10-2021-0183801

(51) Int. Cl.
*H04N 25/75*       (2023.01)
*H01L 27/146*     (2006.01)
*H04N 25/704*     (2023.01)
*H04N 25/772*     (2023.01)

(52) U.S. Cl.
CPC ....... *H04N 25/75* (2023.01); *H01L 27/14621* (2013.01); *H04N 25/704* (2023.01); *H04N 25/772* (2023.01)

(58) Field of Classification Search
CPC .... H04N 25/75; H04N 25/704; H04N 25/772; H04N 23/672; H04N 25/10; H04N 25/77; H04N 25/778; H04N 25/11; H04N 25/59; H01L 27/14621
See application file for complete search history.

(56) References Cited

U.S. PATENT DOCUMENTS

| | | | |
|---|---|---|---|
| 9,137,472 B2* | 9/2015 | Minagawa | H04N 25/75 |
| 9,602,749 B2 | 3/2017 | Yamaguchi et al. | |
| 9,749,556 B2* | 8/2017 | Fettig | H04N 23/672 |
| 10,044,959 B2* | 8/2018 | Galor Gluskin | H04N 23/672 |
| 10,277,849 B2 | 4/2019 | Chao et al. | |
| 10,523,887 B2* | 12/2019 | Kawaguchi | H04N 25/134 |

(Continued)

FOREIGN PATENT DOCUMENTS

KR     20060098954 A     9/2006

*Primary Examiner* — Cynthia Segura
(74) *Attorney, Agent, or Firm* — Fish & Richardson P.C.

(57) ABSTRACT

An image sensor includes a pixel array and a readout circuit. The pixel array includes a first unit pixel region including first, second and third sub-pixel regions having a first color filter, sequentially disposed along a first row line, and sharing a first floating diffusion region, and a second unit pixel region including a first, second and third sub-pixel regions having a second color filter, sequentially disposed along a second row line, and sharing a second floating diffusion region. The readout circuit includes a first analog-digital converter receiving a first pixel signal from the first unit pixel region through a first pixel signal output line and converting the first pixel signal into digital data, and a second analog-digital converter receiving a second pixel signal from the second unit pixel region through a second pixel signal output line and converting the second pixel signal into digital data, wherein at least one of the first unit pixel region and the second unit pixel region further includes a phase detection pixel region.

20 Claims, 15 Drawing Sheets

(56) References Cited

U.S. PATENT DOCUMENTS

| | | | |
|---|---|---|---|
| 11,646,338 B2 * | 5/2023 | Jang | H01L 27/14627 |
| | | | 348/294 |
| 11,678,075 B2 * | 6/2023 | Roh | H04N 23/10 |
| | | | 348/308 |
| 2017/0013217 A1 * | 1/2017 | Lee | H04N 25/585 |
| 2020/0314362 A1 * | 10/2020 | Roh | H04N 25/46 |
| 2021/0120168 A1 * | 4/2021 | Shim | H04N 23/67 |
| 2021/0120214 A1 | 4/2021 | Byun et al. | |
| 2021/0134872 A1 | 5/2021 | Kim et al. | |
| 2021/0250530 A1 | 8/2021 | Paik et al. | |
| 2021/0296382 A1 * | 9/2021 | Ono | H01L 27/14667 |
| 2022/0328548 A1 * | 10/2022 | Lee | H04N 25/778 |
| 2023/0156369 A1 * | 5/2023 | Miyauchi | H04N 25/78 |
| | | | 348/308 |

* cited by examiner

IMAGE SENSOR WITH SHARED FLOATING DIFFUSION REGION

CROSS-REFERENCE TO RELATED APPLICATION

This application claims priority under 35 U.S.C. 119 to Korean Patent Application No. 10-2021-0183801 filed on Dec. 21, 2021 in the Korean Intellectual Property Office, the subject matter of which is hereby incorporated by reference in its entirety.

BACKGROUND

1. Technical Field

The inventive concept relates generally to image sensors.

2. Description of the Related Art

An image sensor is a semiconductor device capable of converting selected wavelength(s) of electromagnetic energy (hereafter, "incident light") into a corresponding electric signal. There are different types of image sensors, such as charge-coupled devices (CCD) and Complementary Metal-Oxide Semiconductor (CMOS) devices.

A CMOS image sensor (or CIS) may include a two-dimensional arrangement of pixels. Each pixel may include, for example, a photodiode (PD)—an element that converts incident light into a corresponding electrical signal.

Ongoing developments in the computer and communications industries have accelerated demands for image sensors exhibiting improved performance across a range of applications, including for example, digital cameras, camcorders, personal communication systems (PCS), game consoles, security systems, medical devices, automobiles, robots, etc. Further, consistent with ongoing trends in semiconductor technologies, image sensors are becoming ever more densely integrated.

SUMMARY

Embodiments of the inventive concept provide image sensors exhibiting improved performance and greater reliability.

According to an embodiment of the inventive concept, an image sensor may include a pixel array and a readout circuit. The pixel array may includes; a first unit pixel region including first, second and third sub-pixel regions having a first color filter, sequentially disposed along a first row line, and sharing a first floating diffusion region, and a second unit pixel region including a first, second and third sub-pixel regions having a second color filter, sequentially disposed along a second row line, and sharing a second floating diffusion region. The readout circuit may include; a first analog-digital converter receiving a first pixel signal from the first unit pixel region through a first pixel signal output line and converting the first pixel signal into digital data, and a second analog-digital converter receiving a second pixel signal from the second unit pixel region through a second pixel signal output line and converting the second pixel signal into digital data, and at least one of the first unit pixel region and the second unit pixel region further includes a phase detection pixel region.

According to an embodiment of the inventive concept, an image sensor may include; a first unit pixel region including sub-pixel regions having color filters of first color type, disposed in a 3×3 matrix, sharing a first floating diffusion region, and including a first phase detection pixel region, a row driver configured to provide a control signal controlling the first unit pixel region through a first row line, a readout circuit configured to detect a voltage apparent on a first column line connected in the first unit pixel region to the first row line when selected by the row driver, and an image signal processing unit configured to generates image data from a first pixel signal received from the first unit pixel region through the first column line, wherein during an auto focusing mode, the image signal processing unit is further configured to generate the image data, omitting at least a portion of the first pixel signal associated with the first phase detection pixel region.

According to an embodiment of the inventive concept, an image sensor may include; a pixel array, a readout circuit, and a signal processor. The pixel array may include; a first unit pixel region including sub-pixel regions having a color filter of first color type, arranged in a 3×3 matrix, sharing a first floating diffusion region, and including a phase detection pixel region, and a second unit pixel region including sub-pixel regions having a color filter of second color type, arranged in a 3×3 matrix, and sharing a second floating diffusion region. The readout circuit may include; a first analog-digital converter configured to receive a first output voltage associated with a first pixel signal generated by the first unit pixel region through a first pixel signal output line, and convert the first output voltage into first digital data, and a second analog-digital converter configured to receive a second output voltage associated with a second pixel signal generated by the second unit pixel region through a second pixel signal output line, and convert the second output voltage into second digital data. The signal processing unit may be configured to generate image data from at least one of the first digital data and the second digital data, and during an auto focusing mode, the signal processing unit may be further configured to generate the image data omitting at least a portion of the first pixel signal.

BRIEF DESCRIPTION OF THE DRAWINGS

Advantages, benefits, and features, as well as the making and use of the inventive concept will become more apparent upon consideration of the following detailed description, together with the accompanying drawings, in which.

DETAILED DESCRIPTION

Throughout the written description and drawings, like reference numbers and labels are used to denote like or similar elements, components, features and/or method steps.

Figure 1:
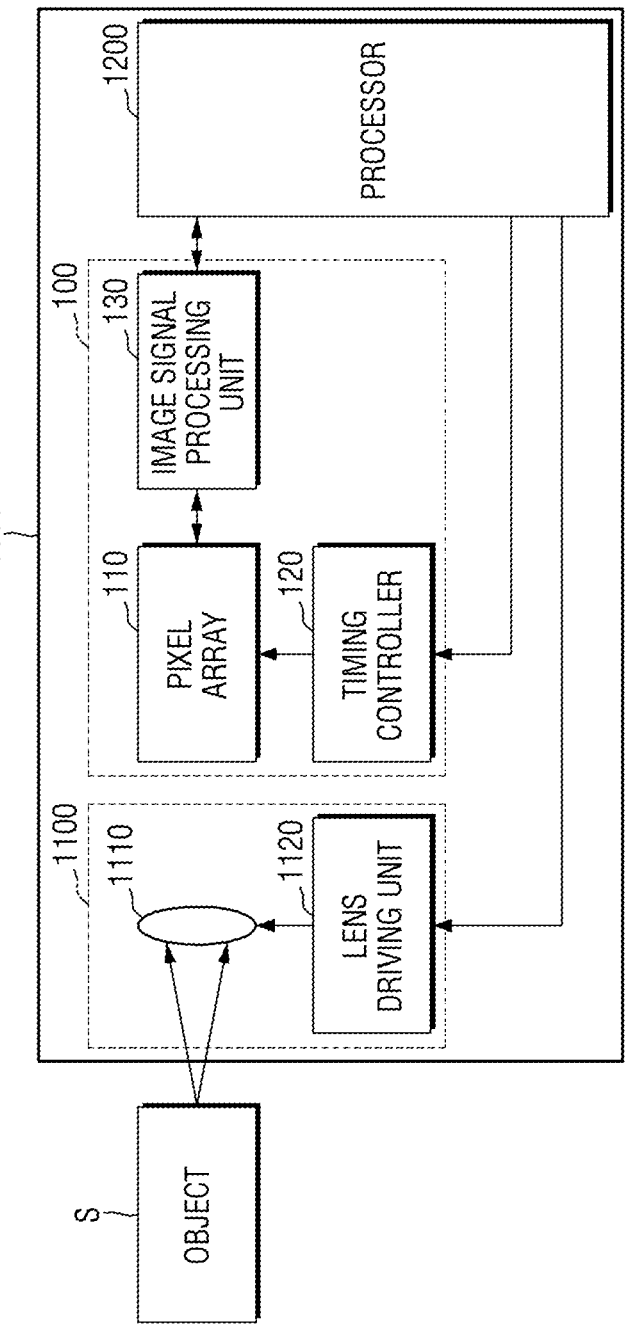
FIG. 1 is a block diagram illustrating an image capturing device according to embodiments of the inventive concept.
Figure 2:
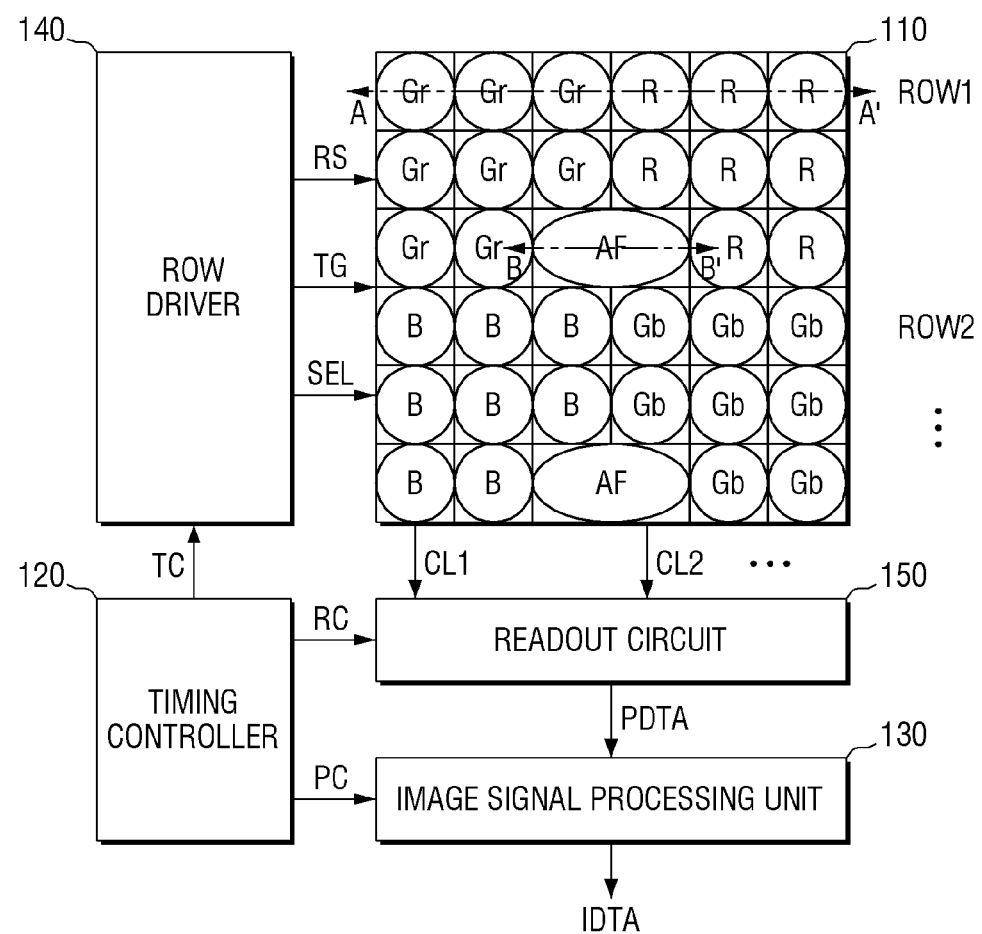
FIG. 2 is a block diagram further illustrating in one example the image sensor 100 of FIG. 1.
Figure 3:
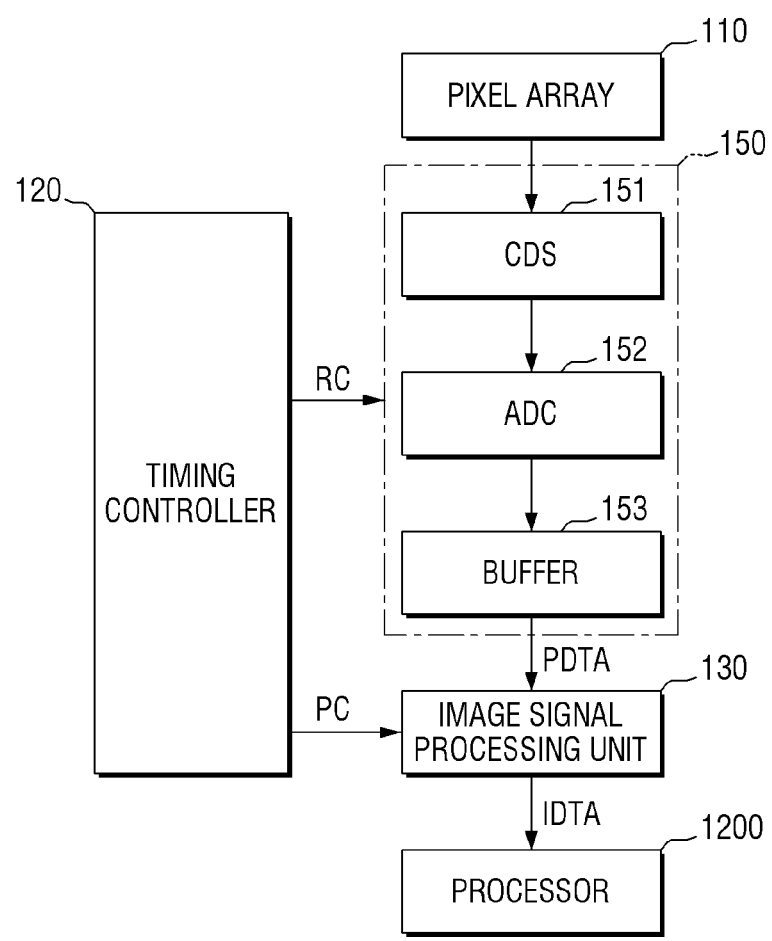
FIG. 3 is a block diagram further illustrating in one example the readout circuit 150 of FIG. 2.

FIG. 1 is a block diagram illustrating an image capturing device 1000 according to embodiments of the inventive concept, FIG. 2 is a block diagram further illustrating in one example the image sensor 100 of FIG. 1, and FIG. 3 is a block diagram further illustrating in one example the readout circuit 150 of FIG. 2.

Referring to FIG. 1, the image capturing device 1000 may generally include an image capturing unit 1100, an image sensor 100, and a processor 1200. The image capturing device 1000 may be used to capture a reflected image of an object S in order to acquire corresponding image data. Those skilled in the art will appreciate that the image capturing device 1100 may include various components (e.g., a lens 1110 and a lens driving unit 1120) performing a variety of functions (e.g., various focusing functions).

Overall operation of the image capturing device 1000 may be controlled by the processor 1200. That is, the processor 1200 may provide control signals and/or various information controlling the operation of various image capturing device components (e.g., the lens driving unit 1120), as well as interoperation between the image capturing device 1120 and various components of the images sensor 100 (e.g., timing controller 120).

The lens 1110 and the lens driving unit 1120 cooperate to receive incident light through an aperture controlled by an aperture driving unit (not shown in FIG. 1).

The lens driving unit 1120 may provide operative feedback (e.g., focus detection) to the processor 1200, and may be used to control the operation of the lens 1110 in response to control signal(s) provided by the processor 1200. In this regard, the lens driving unit 1120 may move the lens 1110 in accordance with variation in a distance between the lens 1110 and the object S. That is, variations in the distance between the lens 1110 and the object S must be compensated for by the lens driving unit 1120 in order to accurately acquire image data and prevent image blurring.

In some embodiments, the image capturing device 1000 may perform phase detection auto focusing (PDAF). For example, when the distance between the lens 1110 and the object S is relatively short, the lens 1110 may be out of an in-focus position relative to the object S, such that a phase difference occurs between the images captured by the image sensor 100. Accordingly, the lens driving unit 1120 may control the lens 1110 such that the distance from the object S is effectively increased in response to control signal(s) provided by the processor 1200. Alternately, when the distance between the lens 1110 and the object S is relatively long, the lens 1110 may be out of the in-focus position relative to the object S, such that a phase difference occurs between images captured by the image sensor 100. Accordingly, the lens driving unit 1120 may control the lens 1110 such that the direction from the object S is effectively increased in response to control signal(s) provided by the processor 1200.

In its operation, the image sensor 100 converts incident light into a corresponding electrical signal—which may be subsequently expressed as digital image data. In the illustrated example of FIG. 1, the image sensor 100 includes a pixel array 110, a timing controller 120, and an image signal processing unit 130. Accordingly, incident light provided from (e.g., reflected by) the object S and communicated through the lens 1110 may illuminate a light-receiving surface of the pixel array 110 to order to "image" the object S.

Assuming that the pixel array 110 is a CIS, the pixel array 110 may include an array (e.g., a matrix of rows and columns) of pixels including sensing pixels and phase detection pixels. Here, a sensing pixel operates to provide image data obtained by capturing the object S, whereas a phase detection pixel operates to detect a phase difference associated with the image data. This phase difference may subsequently be used to adjust the lens 1110.

The processor 1200 may receive image data from the image signal processing unit 130. The processor 120 may then perform one or more image post-processing operations in order to improve the image data received from the sensing pixels. Image post-processing operations may include, for example; parameter adjustment(s) (e.g., brightness, contrast, etc.), noise reduction, gamma correction, color filter array interpolation, color matrix correction, color correction, color enhancement, etc. The processor 1200 may also perform data compression on image data to generate an image file and/or restore image data from an image file.

Alternately or additionally, the processor 1200 may perform one or more phase difference computations on the image data received from the phase detection pixels. Phase difference computations may include, for example, focal positioning, focal direction detection, etc., made in relation to a detected distance between the object S and the image sensor 100. The processor 1200 may also provide control signal(s) to the lens driving unit 1120 in response to results from one or more phase difference computations.

Image capturing device according to embodiments of the inventive concept, like the image capturing device 1000 of FIG. 1, may be variously included in a variety of electronic devices, such as for example, digital cameras, smartphones, wearable devices, Internet of Things (IoT) devices, tablet Personal Computers (PC), laptop computers, Personal Digital Assistants (PDA), Portable Multimedia Players (PMP), navigation devices, display devices, etc. Further, the image capturing device 1000 may be mounted on an electronic device provided as a component in a vehicle, furniture, a manufacturing device, a door, various measuring devices, etc.

Referring to FIG. 2, the image sensor 100 may generally include a pixel array 110, a timing controller 120, an image signal processing unit 130, a row driver 140, and a readout circuit 150.

Figure 6:
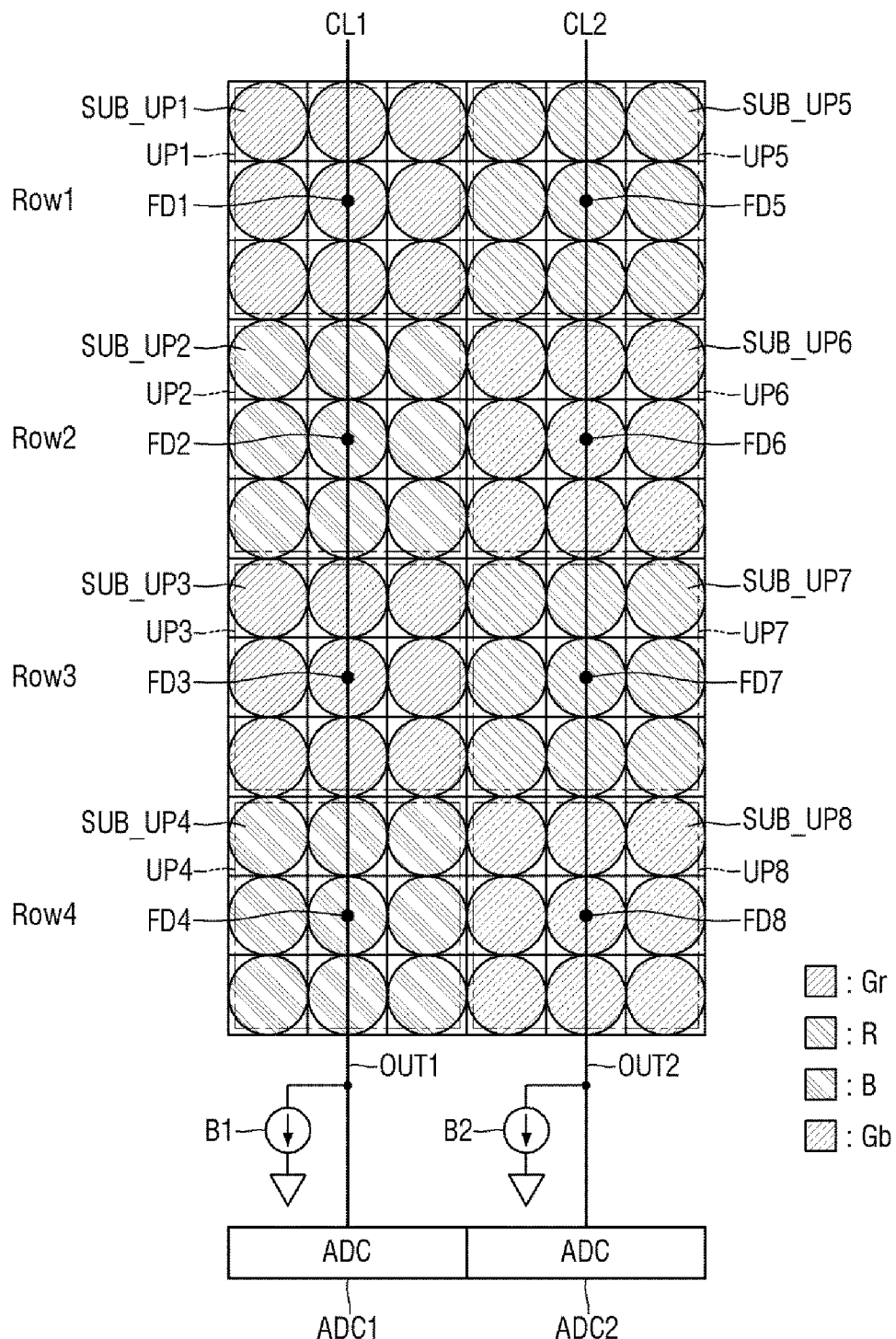
FIG. 6 is a diagram further illustrating in one example the pixel array 110 of FIG. 2.

Referring to FIG. 2, as well as FIG. 6 described in some additional detail hereafter, the pixel array 110 may include unit pixel regions UP1, UP2, UP3, UP4, UP5, UP6, UP7, and UP8 (hereafter collectively, "UP1 to UP8"), wherein each unit pixel region of UP1 to UP8 further includes sub-pixel regions SUB_UP1, SUB_UP2, SUB_UP3, SUB_UP4, SUB_UP5, SUB_UP6, SUB_UP7, and SUB_UP8 (hereafter collectively, "SUB_UP1 to SUB_UP8") arranged in a 3×3 matrix. Thus, in the illustrated example of FIGS. 2 and 6, the first sub-pixel regions SUB_UP1 is arranged in a 3×3 matrix within the first unit pixel region UP1 and may be understood as including a total nine (9) distinct regions. In some embodiments, the first unit pixel region UP1 may include at least a portion of one phase detection pixel region AF associated with a phase detection pixel.

Each of the sub-pixel regions SUB_UP1 to SUB_UP8 may include sensing pixels (e.g., respective light sensing elements, such as a photodiode). Here, each light sensing element may generate electrical charge corresponding to received incident light (e.g., optical charge), and thereafter convert the optical charge into a corresponding electrical signal (e.g., a voltage or a current). This electrical signal may be referred to as a "pixel signal" which may be provided to an external circuit through a pixel signal output line. (See, e.g., OUT1 and OUT2 of FIG. 6).

The pixel signal may include a number of image signals respectively provided by the sub-pixel regions SUB_UP1 to SUB_UP8. That is, extending the example of FIG. 1, the sub-pixel regions SUB_UP1 to SUB_UP8 may respectively generate image signals associated with the capture of the object S, and then collectively provide the image signals as the pixel signal.

The phase detection pixel region AF may generate phase signals used for calculating phase difference(s) between images generated upon the capture of the object S.

In some embodiments, the unit pixel regions UP1 to UP8 may be variously arranged in a number of rows (e.g., Row1, Row2, etc.) and/or a number columns (e.g., CL1, CL2, etc.). As a result, and in the context of the illustrated embodiment of FIG. 6, the first unit pixel region UP1 may be said to be "row-adjacent" to the fifth unit pixel region UP5, and "column-adjacent" to the second unit pixel region UP2.

Referring to FIG. 2, the timing controller 120 may control the operation of the pixel array 110 in absorbing incident light, accumulating the resulting electrical charge, and/or temporarily storing the accumulated electrical charge. In this regard, the timing controller 120 may control the operation of the row driver 140 through the provision of timing control signal(s) in order to generate and accumulate electrical charge, store the accumulated charge, generate the images signals, generate the pixel signals, and provide the pixel signal to circuitry external to the pixel array 110.

In some embodiments, the row driver 140 may control the pixel array 110 in units of row lines in response to control signal(s) provided by the timing controller 120. In this regard, the row driver 140 may select at least one row line from among a number of row lines in the pixel array 110 in response to a received row address. In this manner, the sub-pixel regions SUB_UP1 to SUB_UP8 and the phase detection pixel regions AF may be controlled on a row basis. The row driver 140 may be used to decode the row address, and variously control the operation of the sub-pixel regions SUB_UP1 to SUB_UP8 and the phase detection pixel regions AF selectively connect selection transistor(s) AX, reset transistor(s) RX, and/or source follower transistor(s) SX. Accordingly, in some embodiments, the pixel array 110 may be driven by drive signals provided by the row driver 140 that include at least a pixel selection signal SEL, a reset signal RS, and a charge transfer signal TS.

Referring to FIGS. 2 and 3, in some embodiments, the readout circuit 150 may include a sampling circuit 151, an analog-to-digital converter (ADC) 152, and a buffer 153.

The sampling circuit 151 may generate a comparison result signal to which the correlated double sampling (CDS) is applied, which may be referred to as a correlated double sampling circuit. However, the pixel signals provided by the sub-pixel regions SUB_UP1 to SUB_UP8 regions may deviate from specification (and amongst themselves) due to certain pixel-specific characteristics (e.g., Fixed Pattern Noise (FNP), etc.) and/or logic-specific characteristics related to logic used during the output of the pixel signal. In order to compensate for deviation(s) between the pixel signals, a technique may be used that obtains a reset component (or reset signal) and image components (or image signal) for each of the pixel signals, and than extract a difference as effective control signal. This technique is referred to as correlated double sampling. In this regard, the readout circuit 150 may then output pixel data PDTA resulting from the correlated double sampling to the image signal processing unit 130. The image signal processing unit may then output image data IDTA to the processor 1200.

The ADC 152 may be connected to the pixel array 110 through the column lines (e.g., CL1, CL2, etc.). The ADC 152 may be used to convert analog signals received from the pixel array 110 through the column lines (CL1, CL2, . . . ) into corresponding digital signals. The number of ADCs 152 may be determined on the basis of a number of unit pixel regions disposed along the row lines, as well as a number of column lines.

The buffer 153 may be used to latch and output data from each column line, as provided by the ADC(s) 152. Here, the buffer 153 may temporarily store the data output by the ADC 152 in response to control signal(s) from the timing controller 120, and then sequentially output the latched data through a column decoder.

The image signal processing unit 130 may perform various signal processing on the pixel data PDTA, such as digital binning, noise reduction, gain adjustment, waveform shaping, interpolation, white balancing, gamma correction, edge enhancement, etc. The image signal processing unit 130 may also periodically output phase information associated with the phase detection pixels to the processor 1200, such as during phase detection auto focusing, or other operations requiring a phase difference computation. In some embodiments, the functionality ascribed above to the image signal processing unit 130 may be subsumed (e.g.,) within the image processor 1200. That is, the image signal processing unit 130 may be provided external to the image sensor 100.

Figure 4:
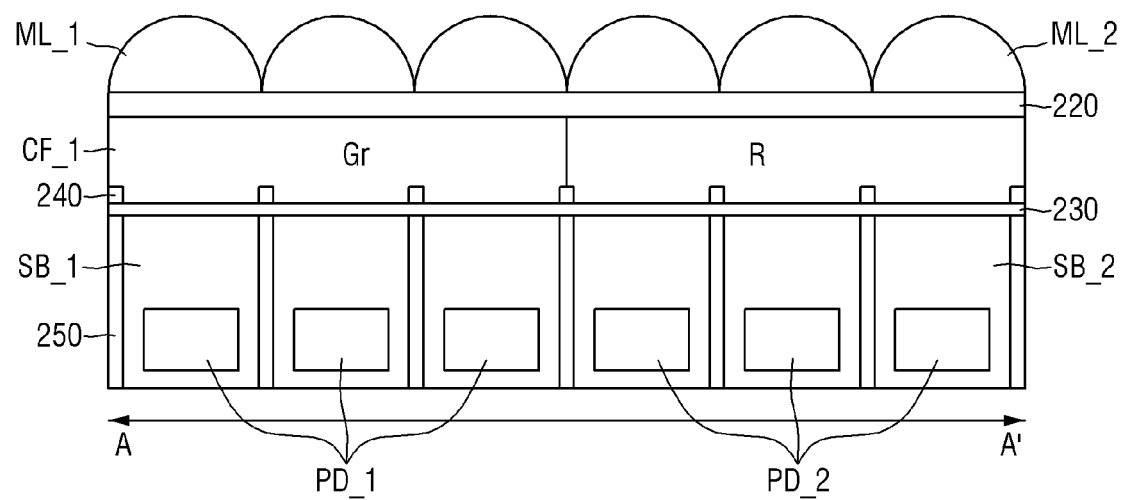
FIG. 4 is a cross-sectional view taken along line A-A' of FIG. 2.

FIG. 4 is a cross-sectional view taken along line A-A' of FIG. 2.

Referring to FIG. 4, the image sensor 100 may include substrates SB_1 and SB_2, photoelectric conversion layers PD_1 and PD_2, an antireflection film 250, a side antireflection film 240, a color filter CF_1, an upper flattening film 220, a lower flattening film 230, and microlenses ML_1 and ML_2.

The substrates SB_1 and SB_2 may be implemented, for example, as a P-type or N-type bulk substrate. Alternately, a P-type or N-type epitaxial layer may be grown on the P-type bulk substrate, or a P-type or N-type epitaxial layer may be grown on the N-type bulk substrate. The substrates SB_1 and SB_2 may include a plastic material and/or a semiconductor material.

The photoelectric conversion layers PD_1 and PD_2 may include at least one of a photodiode, a phototransistor, a photogate, and a pinned photodiode.

The antireflection film 250 and the side antireflection film 240 prevent external electromagnetic energy (e.g., visible light) incident to the microlenses ML_1 and ML_2 from penetrating into one or more color region(s) (e.g., the green (Gr) region and the red (R) region of FIGS. 2 and 4). The antireflection film 250 and the side antireflection film 240 may include an insulating film, such as for example, a silicon oxide film, a silicon nitride film, a silicon oxynitride film, and/or a resin.

The upper flattening film 220 and the lower flattening film 230 may be used to level or flatten upper and lower interface surfaces associated with the color filter CF_1. Here, each of the upper flattening film 220 and the lower flattening film 230 may include at least one for example, a silicon oxide film-series material, a silicon nitride film-series material, and/or a resin.

Figure 5:
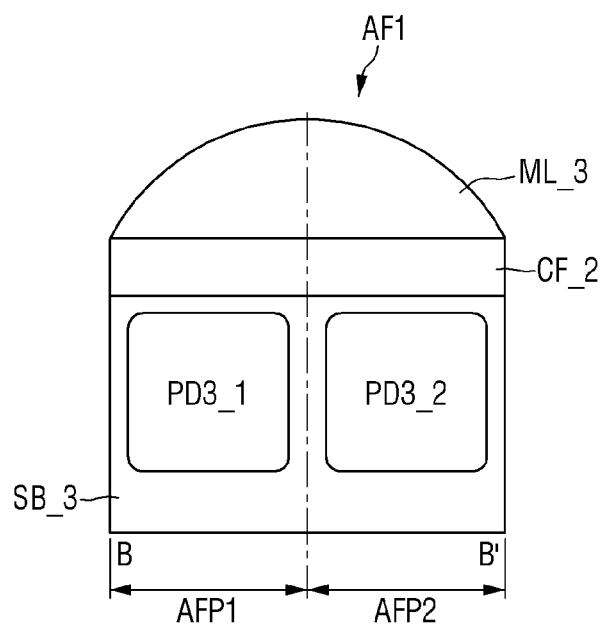
FIG. 5 is a cross-sectional view taken along line B-B' of FIG. 2.

FIG. 5 is a cross-sectional view taken along line B-B' of FIG. 2.

Referring to FIGS. 2 and 5, each phase detection pixel region (e.g., AF1) may include phase detection pixels (e.g., AFP1 and AFP2) and at least one microlens (e.g., ML_3). In the illustrated embodiment of FIG. 5, the phase detection pixels AFP1 and AFP2 may increase an overall number of pixels per unit area within the pixel array 110 by sharing a single microlens ML_3. That is, the phase detection pixels AFP1 and AFP2 included in the phase detection pixel region AF1 may include a single color filter CF_2, and may therefore have the same color. This result follows from a requirement that incident light of substantially the same wavelength is required to perform phase difference computations. However, the scope of the inventive concept is not limited to only the specific example illustrated in FIG. 5.

Extending the example of FIG. 5, the phase detection pixels AFP1 and AFP2 shield, at least in part, the photodiodes PD3_1 and PD3_2 with a metal structure disposed in substrate SB_3, and may therefore detect only light incident not shielded by the metal structure. In this manner, phase differences may be detected using pixels shielded with the metal structure and not shielded with the metal structure.

Figure 7:
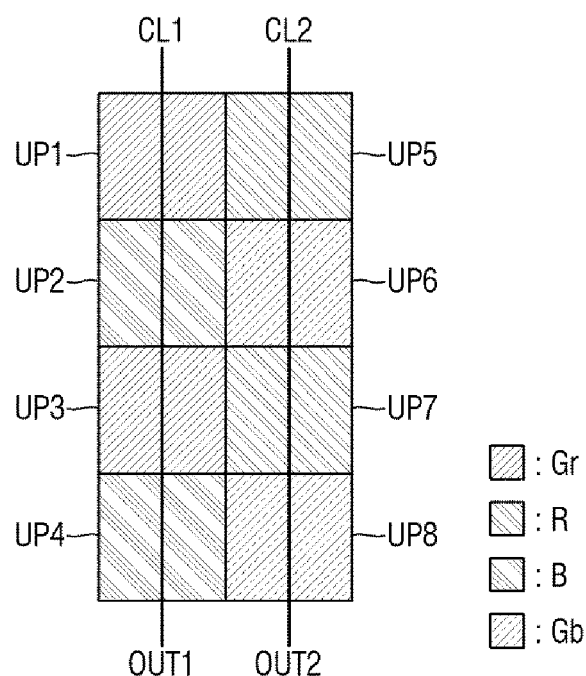
FIG. 7 is a plan (or top-down) view of an image sensor according to embodiments of the inventive concept.
Figure 8:
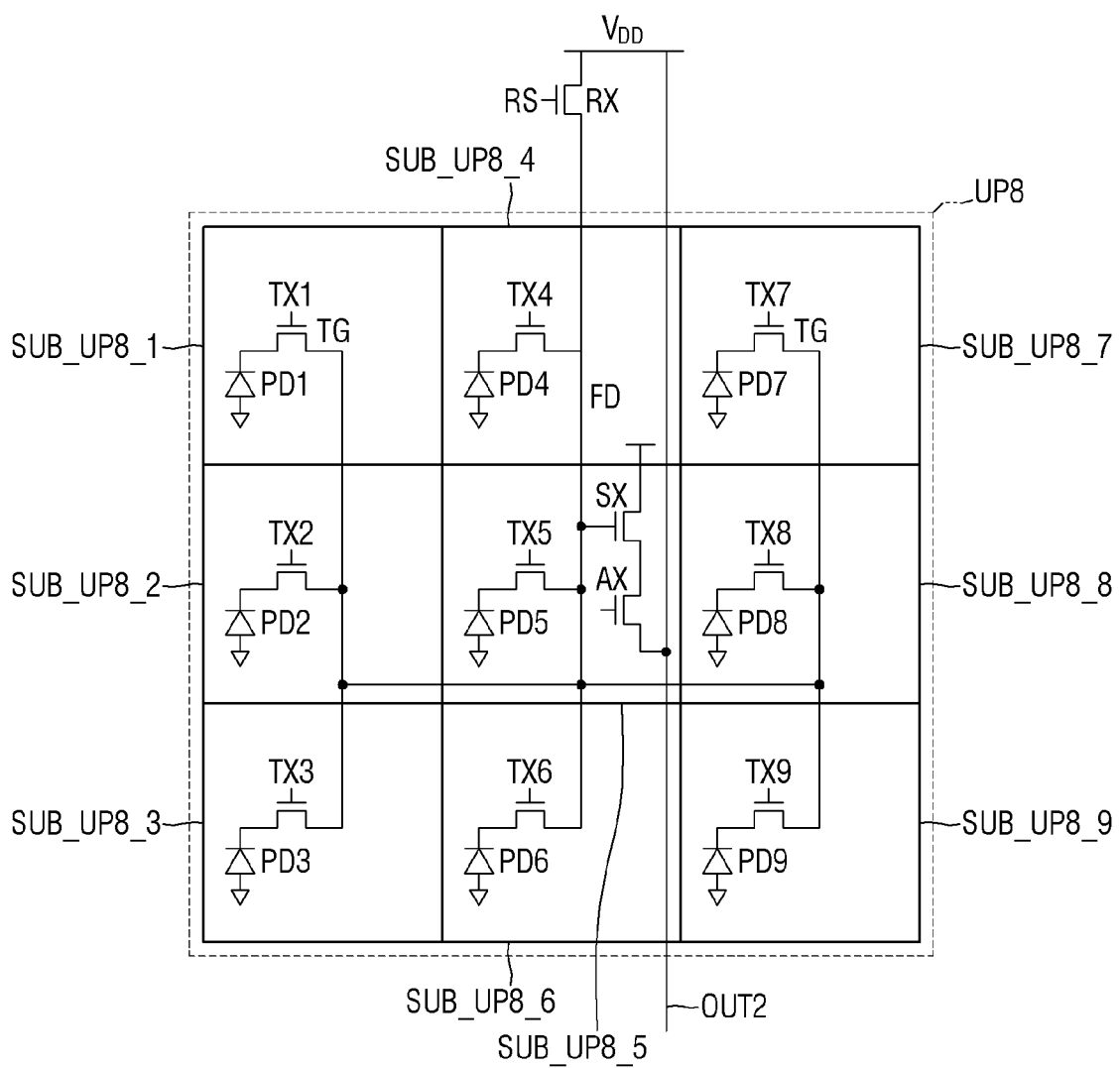
FIG. 8 is a circuit diagram further illustrating in one example operation of a unit pixel region of the pixel array 110 of FIG. 2.

FIG. 6 is a diagram further illustrating in one example the pixel array 110 of FIG. 2, FIG. 7 is a plan view further illustrating an image sensor according to embodiments of the inventive concept, and FIG. 8 is a circuit diagram further illustrating operation of a unit pixel region in the pixel array 110 of FIG. 2.

Referring to FIG. 6, the unit pixel regions UP1 to UP8 disposed within the pixel array 110 may respectively include the sub-pixel regions SUB_UP1 to SUB_UP8, selectively configured to sense blue (B), green (Gb, Gr), or red (R) colors. That is, referring to FIGS. 4 and 6, each of the sub-pixel regions SUB_UP1 to SUB_UP8 may include a single color filter CF_1 allowing for the selective transmission of incident light associated with the corresponding color. Although the illustrated example of FIG. 6 assumes the use of color filters CF_1 filtering blue, green, and red colors, the scope of the inventive concept is not limited thereto.

The sub-pixel regions SUB_UP1 to SUB_UP8 respectively included in each of the unit pixel regions UP1 to UP8 may commonly share a floating diffusion region (e.g., FD1, FD2, FD3, FD4, FD5, FD6, FD7, and FD8 respectively associated with the unit pixel regions UP1 to UP8. For example, the first sub-pixel regions SUB_UP1 included in the first unit pixel region UP1 may share the first floating diffusion region FD1, the second sub-pixel regions SUB_UP2 included in the second unit pixel region UP2 may share the second floating diffusion region FD2, the third sub-pixel regions SUB_UP3 included in the third unit pixel region UP3 may share the third floating diffusion region FD3, and so forth. And because the sub-pixel regions SUB_UP1 to SUB_UP8 included in the unit pixel regions UP1 to UP8 each share a single floating diffusion region, it is possible to efficiently amplify into signals to generate a corresponding pixel signal.

Further, in the illustrated example of FIG. 6, the first, second, third and fourth unit pixel regions UP1 to UP4 and the fifth, sixth, seventh and eighth unit pixel regions UP5 to UP8 may output the pixel signals through first and second pixel signal output lines OUT1 and OUT2. That is, sub-pixel regions SUB_UP1 to SUB_UP4 of the first to fourth unit pixel regions UP1 to UP4 may be connected to the first column lines CL1, and sub-pixel regions SUB_UP5 to SUB_UP8 of the fifth to eighth unit pixel regions UP5 to UP8 may be connected to the second column line CL2. Accordingly, pixel signals generated according to row lines units may be provided in relation to respective column lines.

Alternately expressed, the pixel signal generated by the first sub-pixel region SUB_UP1 of the first unit pixel region UP1 disposed in a first row line ROW1, the pixel signal generated by the second sub-pixel region SUB_UP2 of the second unit pixel region UP2 disposed in a second row line ROW2, the pixel signal generated by the third sub-pixel region SUB_UP3 of the third unit pixel region UP3 disposed in the third row line ROW3, and the pixel signal generated by the fourth sub-pixel region SUB_UP4 of the fourth unit pixel region UP4 disposed in the fourth row line ROW4 may be commonly output through the first pixel signal output line OUT1. Accordingly, with this configuration high-quality images may be acquired, even in relatively low illuminance environments, in relation to pixel signals collectively generated by the sub-pixel regions SUB_UP1 to SUB_UP8.

A first ADC (ADC1) may receive an output voltage associated with pixel signals output by the first to fourth unit pixel regions UP1, UP2, UP3, and UP4 through the first pixel signal output line OUT1 and convert the output voltage into corresponding digital data. Thus, pixel signals generated by the first to fourth unit pixel regions UP1, UP2, UP3, and UP4 may be read to the first ADC through the same first pixel signal output line OUT1.

A second ADC (ADC2) may receive an output voltage associated with pixel signals output by the fifth to eighth unit pixel regions UP5, UP6, UP7, and UP8 through the second pixel signal output line OUT2 and convert the output voltage into corresponding digital data. Thus, pixel signals generated by the fifth to eight unit pixel regions UP5, UP6, UP7, and UP8 may each be read to the second ADC through the same second pixel signal output line OUT2.

Referring to FIG. 6, the image sensor 100 may further include first and second bias circuits B1 and B2, respectively connected to the first and second pixel signal output lines OUT1 and OUT2.

Referring to FIG. 7 and recognizing that the row driver 140 may sequentially select row lines, photoelectric conversion signals corresponding to the pixels of the row lines may be received through multiplexers respectively associated with the first column line CL1 and the second column line CL2.

FIG. 8 is a circuit diagram further illustrating operation of a unit pixel region (e.g., the eighth unit pixel region UP8 from among the first to eighth unit pixel regions UP1 to UP8 of FIG. 6). Those skilled in the art will appreciate that the first to seventh unit pixel regions UP1 to UP7 may be similarly operated.

Referring to FIG. 8, the eighth unit pixel region UP8 may include nine (9) sub-pixel regions (e.g., SUB_UP8_1, SUB_UP8_2, SUB_UP8_3, SUB_UP8_4, SUB_UP8_5, SUB_UP8_6, SUB_UP8_7, SUB_UP8_8, and SUB_UP8_9) disposed in a 3×3 matrix. In some embodiments, the nine sub-pixel regions SUB_UP8_1 to SUB_UP8_9 may respectively include nine (9) photoelectric conversion layers PD1, PD2, PD3, PD4, PD5, PD6, PD7, PD8, and PD9, and nine (9) transfer transistors TX1, TX2, TX3, TX4, TX5, TX6, TX7, TX8, and TX9. However, the sub-pixel regions SUB_UP8_1 to SUB_UP8_9 may include one floating diffusion region FD, a reset transistor RX, a source follower transistor SX, and a selection transistor AX.

The photoelectric conversion layers PD1 to PD9 may generate electrical charge in proportion with an amount of received light incident. In some embodiments, the photoelectric conversion layers PD1 to PD9 may be photodiodes including an N-type impurity region and a P-type impurity region. The photoelectric conversion layers PD1 to PD9 may be coupled to transfer transistors TX1 to TX9 that transfer the accumulated electrical charge to the floating diffusion region FD. In this regard, the floating diffusion region FD is a region that switches (or converts) the electrical charge to a corresponding voltage. That is, a parasitic capacitance associated with the floating diffusion region FD) may be used to accumulate the electrical charge.

One end of each of the transfer transistors TX1 to TX9 may be respectively connected to one of the photoelectric conversion layers PD1 to PD9, and another end of each of the transfer transistors TX1 to TX9 may be commonly connected to the floating diffusion region FD. The transfer transistors TX1 to TX9 may be driven by respective transfer signals applied through corresponding transfer gates. That is, the transfer transistors TX1 to TX9 may be used to transfer the electric charge generated by the photoelectric conversion layers PD1 to PD9 to the floating diffusion region FD in response to transfer signals.

Referring to FIGS. 2 and 8, the row driver 140 may be used to control the operation of the transfer transistors TX under the control of the timing controller 120. That is, each transfer transistor TX may be turned ON to output the optical charge accumulated by a photoelectric conversion layer PD. In some embodiments, the transfer transistors TX associated with each of the sub-pixel regions SUB_UP1 to SUB_UP8 may be individually driven. For example, the row driver 140 may individually control the transfer transistors TX1 to TX9, turning them ON to output the optical charge accumulated by the photoelectric conversion layers PD1 to PD9.

However, when the image capture unit 1100 of FIG. 1 operates in an auto focusing mode, the row driver 140 may control the transfer transistor TX of the phase detection pixel region AF, and turn OFF the transfer transistor TX to halt output optical charges accumulated by the photoelectric conversion layer PD of the phase detection pixel region AF. That is, the row driver 140 may turn OFF the transfer transistor TX by not selecting the row lines in which the phase detection pixel region AF is disposed. Subsequently, the signal processing unit 130 may generate image data, except for image data generated in relation to pixel signal(s) associated with the phase detection pixel region AF.

Referring again to FIGS. 2 and 8, the signal processing unit 130 may generate image data resulting from the first to eighth sub-pixel regions SUB_UP8_1 to SUB_UP8_8, except for a unit pixel region (e.g., the eight unit pixel region UP8) associated with the phase detection pixel region AF. That is, the signal processing unit 130 may generate image data resulting from the first to seventh sub-pixel regions SUB_UP8_1 to SUB_UP8_7, except for a unit pixel region (e.g., the eight unit pixel region UP8) associated with the phase detection pixel region AF.

Those skilled in the art will appreciate that the arrangement relationships associated with a phase detection pixel region AF are not limited to only that illustrated in FIG. 2. Additional examples will be described hereafter in relation to FIGS. 11 to 15.

Referring to FIG. 8, the source follower transistor SX may amplify a change in the electric potential of the floating diffusion region FD that receives the electrical charge from the photoelectric conversion layers PD1 to PD9 and output same to the second pixel signal output line OUT2. When the source follower transistor SX is turned ON, a predetermined electrical potential provided to the drain of the source follower transistor SX (e.g., a power supply voltage $V_{DD}$) may be transferred to a drain region of the selection transistor AX. A source follower gate of the source follower transistor SX may be connected to the floating diffusion region FD.

The selection transistor AX may be used to select a unit pixel region to be read in units of row lines. The selection transistor AX may include a transistor driven by a selection line applying a row line selection signal through a corresponding selection gate.

The reset transistor RX may be used to periodically reset the floating diffusion region FD. The reset transistor RX may include a transistor driven by a reset line applying a reset signal to a corresponding reset gate. When the reset transistor RX is turned ON by the reset signal, a predetermined electrical potential provided to the drain of the reset transistor RX (e.g., $V_{DD}$) may be transferred to the floating diffusion region FD.

In some embodiments, an image sensor including sub-pixel regions SUB_UP8_1 to SUB_UP8_9 may be arranged in a 3×3 matrix, and yet share a single floating diffusion region FD. With this configuration, the overall number of elements required to read the signals from each pixel may be minimized And as a further result, the overall noise apparent in the constituent semiconductor device may be reduced, and yet a high integration density may be readily achieved.

Figure 9:
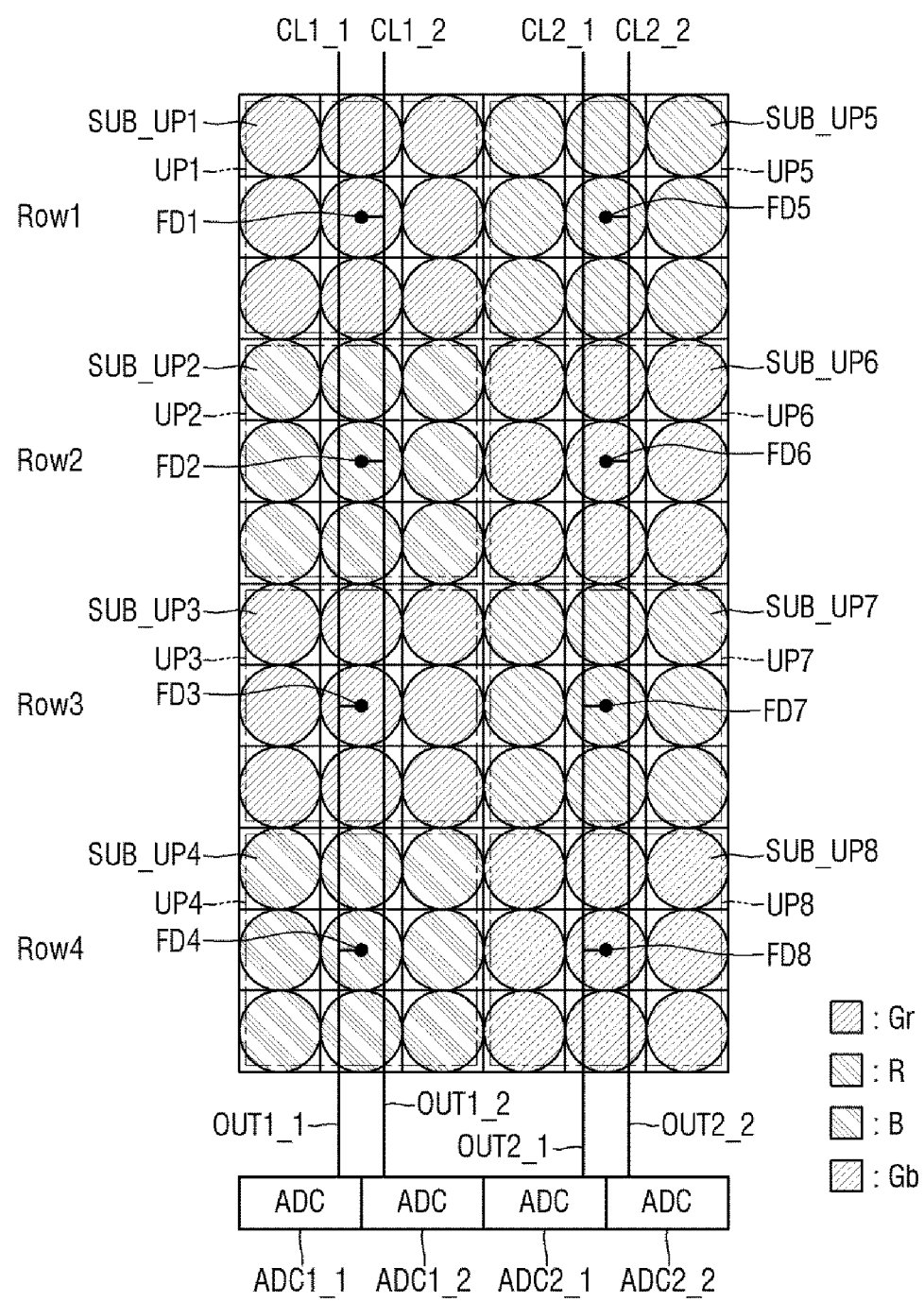
FIGS. 9 and 10 are respective diagrams further illustrating in various examples the readout circuit of an image sensor according to embodiments of the inventive concept.
Figure 10:
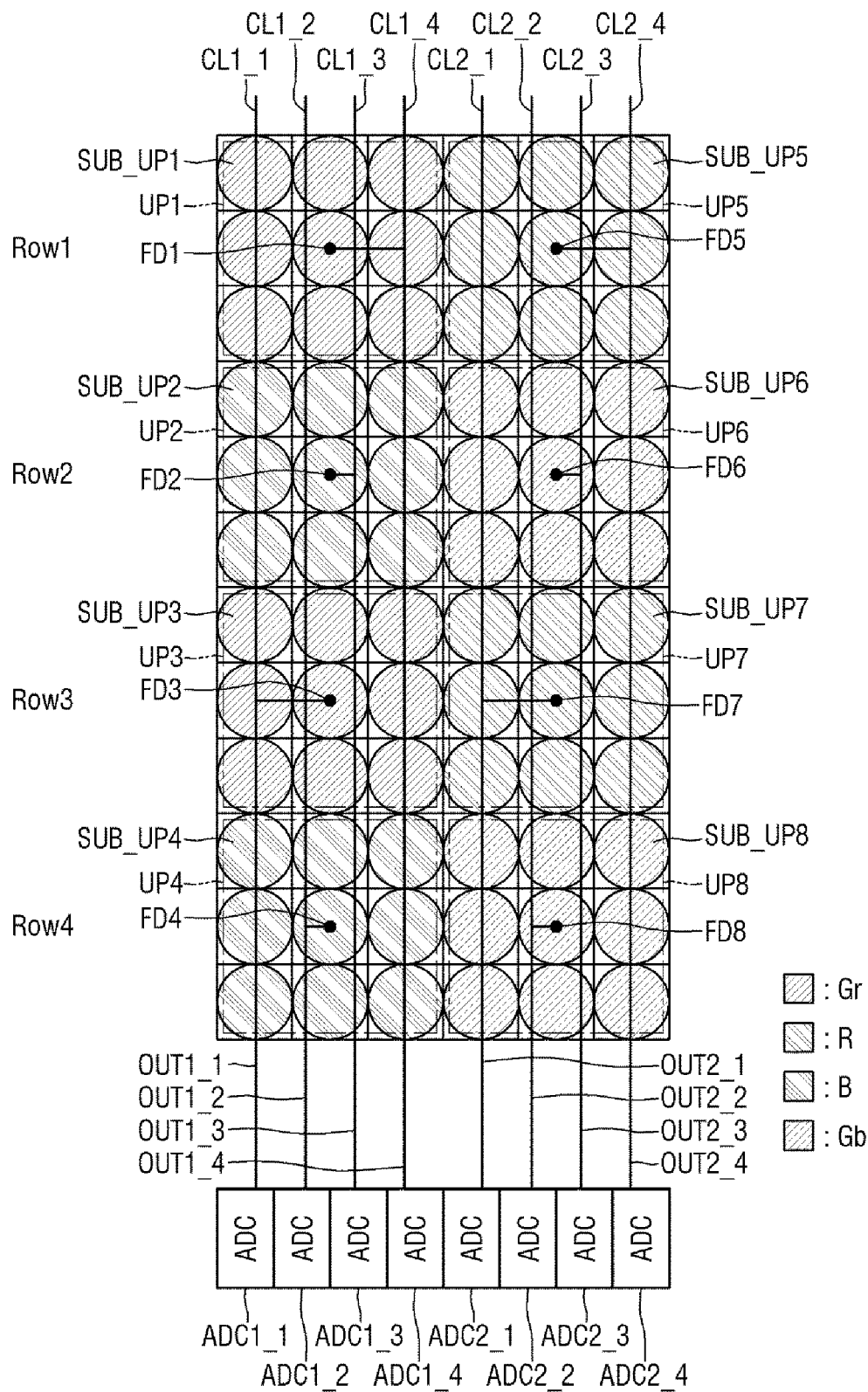

FIGS. 9 and 10 are respective diagrams further illustrating operation of a readout circuit associated with image sensors according to embodiments of the inventive concept.

Of note with reference to FIGS. 9 and 10, a greater number of pixel signal output lines and a greater number of ADCs may be used, as compared with the embodiment illustrated in FIG. 6.

Referring to FIG. 9, the first and second unit pixel regions UP1 and UP2 and the third and fourth unit pixel regions UP3 and UP4 may each output the pixel signals through first_2 and first_1 pixel signal output lines OUT1_2 and OUT1_1, whereas the fifth and sixth unit pixel regions UP5 and UP6 and seventh and eight unit pixel regions UP7 and UP8 may each output pixel signals through second_2 and second_1 pixel signal output lines OUT2_2 and OUT2_1

Sub-pixel regions SUB_UP1 and SUB_UP2 of the first and second unit pixel regions UP1 and UP2, sub-pixel regions SUB_UP3 and SUB_UP4 of the third and fourth unit pixel regions UP3 and UP4, sub-pixel region SUB_UP5 and SUB_UP6 of the fifth and sixth unit pixel regions UP5 and UP6, and sub-pixel regions SUB_UP7 and SUB_UP8 of the seventh and eight unit pixel regions UP7 and UP8, which are included on the same column line, may output the pixel signals in units of row lines.

A first_2 ADC (or a first-second ADC or ADC1_2) may receive the output voltage of the pixel signals, which are output from the first and second unit pixel regions UP1 and UP2 each disposed on the first and second row lines ROW1 and ROW2, from the first_2 pixel signal output line OUT1_2, and convert the output voltage into digital data. In this case, the pixel signals output from the first and second unit pixel regions UP1 and UP2 may each be read to the first_2 ADC through the same first_2 pixel signal output line OUT1_2.

A first_1 ADC (or first-first ADC or ADC1_1) may receive the output voltage of the pixel signal, which are output from the third and fourth unit pixel regions UP3 and UP4 each disposed on the third and fourth row lines ROW3 and ROW4, from the first_1 pixel signal output line OUT1_1, and may convert the output voltage into digital data. In this case, the pixel signals output from the third and fourth unit pixel regions UP3 and UP4 may each be read to the first_1 ADC through the same first_1 pixel signal output line OUT1_1.

A second_2 ADC (or a second-second ADC or ADC2_2) may receive the output voltage of the pixel signals, which are output from the fifth and sixth unit pixel regions UP5 and UP6 each disposed on the first and second row lines ROW1 and ROW2, from the second_2 pixel signal output line OUT2_2, and may convert the output voltage into digital data. In this case, the pixel signals output from the fifth and sixth unit pixel regions UP5 and UP6 may each be read to the second_2 ADC through the same second_2 pixel signal output line OUT2_2.

A second_1 ADC (or a second-first ADC or ADC2_1) may receive the output voltage of the pixel signals, which are output from the seventh and eight unit pixel regions UP7 and UP8 each disposed on the third and fourth row lines ROW3 and ROW4, from the second_1 pixel signal output line OUT2_1, and may convert the output voltage into digital data. In this case, the pixel signals output from the seventh and eight unit pixel regions UP7 and UP8 may each be read to the second_1 ADC through the same second_1 pixel signal output line OUT2_1.

Referring to FIG. 10, the first and second unit pixel regions UP1 and UP2 may each output pixel signals through first_4 and first_3 pixel signal output lines OUT1_4 and OUT1_3, the third and fourth unit pixel regions UP3 and UP4 may each output pixel signals through the first_1 and first_2 pixel signal output lines OUT1_1 and OUT1_2, the fifth and sixth unit pixel regions UP5 and UP6 may each output the pixel signals through the second_4 and second_3 pixel signal output lines OUT2_4 and OUT2_3, and the seventh and eight unit pixel regions UP7 and UP8 may each output the pixel signals through the second_1 and second_2 pixel signal output lines OUT2_1 and OUT2_2.

The sub-pixel regions SUB_UP1 to SUB_UP8 of the first to eighth unit pixel regions UP1 to UP8 are disposed on different column lines and may output pixel signals in units of row line.

For example, a first_4ADC (or fourth-first ADC or a ADC1_4) may receive the output voltage of the pixel signals, which are output from the first unit pixel regions UP1 each disposed on the first row line ROW1, from the first_4 pixel signal output line OUT1_4, and may output the output voltage into digital data. A first_3 ADC (or third-first ADC or ADC1_3) may receive the output voltage of the pixel signals, which are output from the second unit pixel regions UP2 each disposed on the second row line ROW2, from the first_3 pixel signal output line OUT1_3, and may convert the output voltage into digital data. The first_1 ADC (a first-first ADC or ADC1_1) may receive the output voltage of the pixel signals, which are output from the third unit pixel regions UP3 each disposed on the third row line ROW3, from the first_1 pixel signal output line OUT1_1, and may convert the output voltage into digital data. The first_2 ADC (a second-first ADC or ADC1_2) may receive the output voltage of the pixel signals, which are output from the fourth unit pixel regions UP4 each disposed on the fourth row line ROW4, from the first_2 pixel signal output line OUT1_2, and may convert the output voltage into the digital data.

In this case, each pixel signal output from the first to eighth unit pixel regions UP1 to UP8 may each be read to a different one of the ADCs ADC1_1 to ADC2_4 through different pixel signal output lines OUT1_1 to OUT2_4. This configuration results in a higher frame rate for the image sensor.

FIGS. 11 to 15 are respective diagrams illustrating various pixel arrays that may be used in image sensors according to embodiments of the inventive concept.

Figure 11:
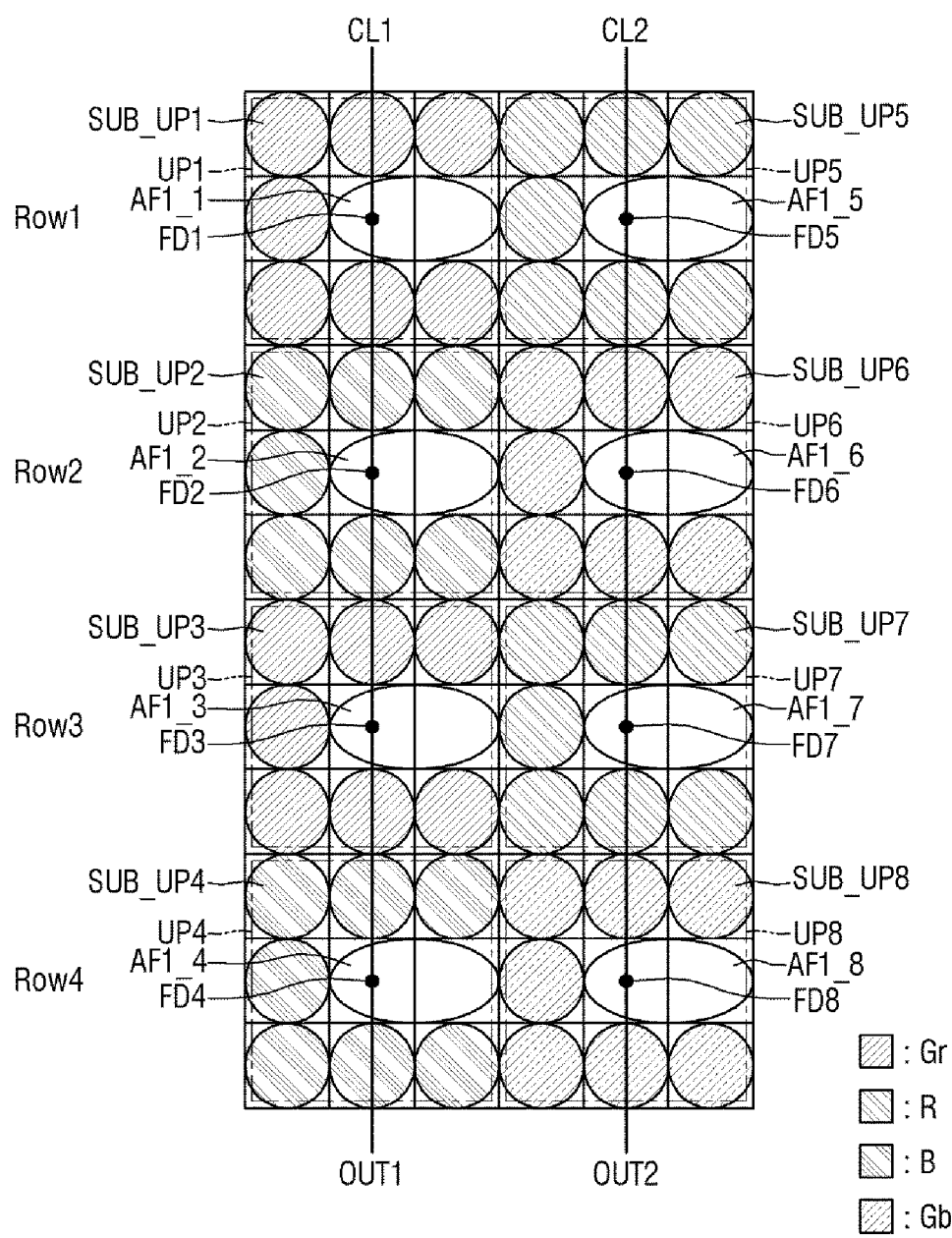
FIGS. 11, 12, 13, 14 and 15 (hereafter collectively, "FIGS. 11 to 15") are respective diagrams further illustrating in various examples a pixel array of the image sensor according to embodiments of the inventive concept.

Referring to FIG. 11, the phase detection pixel regions AF1_1 to AF1_8 may be included in the unit pixel regions UP1 to UP8. For example, two regions among the nine sub-pixel regions SUB_UP1 may be the phase detection pixel region AF1_1. The phase detection pixel regions AF1_1, AF1_2, AF1_3, AF1_4, AF1_5, AF1_6, AF1_7, and AF1_8 included in each of the unit pixel regions UP1 to UP8 may be arranged side by side in the direction of the row lines. For example, the phase detection pixels included in one phase detection pixel region AF1_1 may be disposed in the same unit pixel region UP1 to detect light of the same color.

Figure 12:
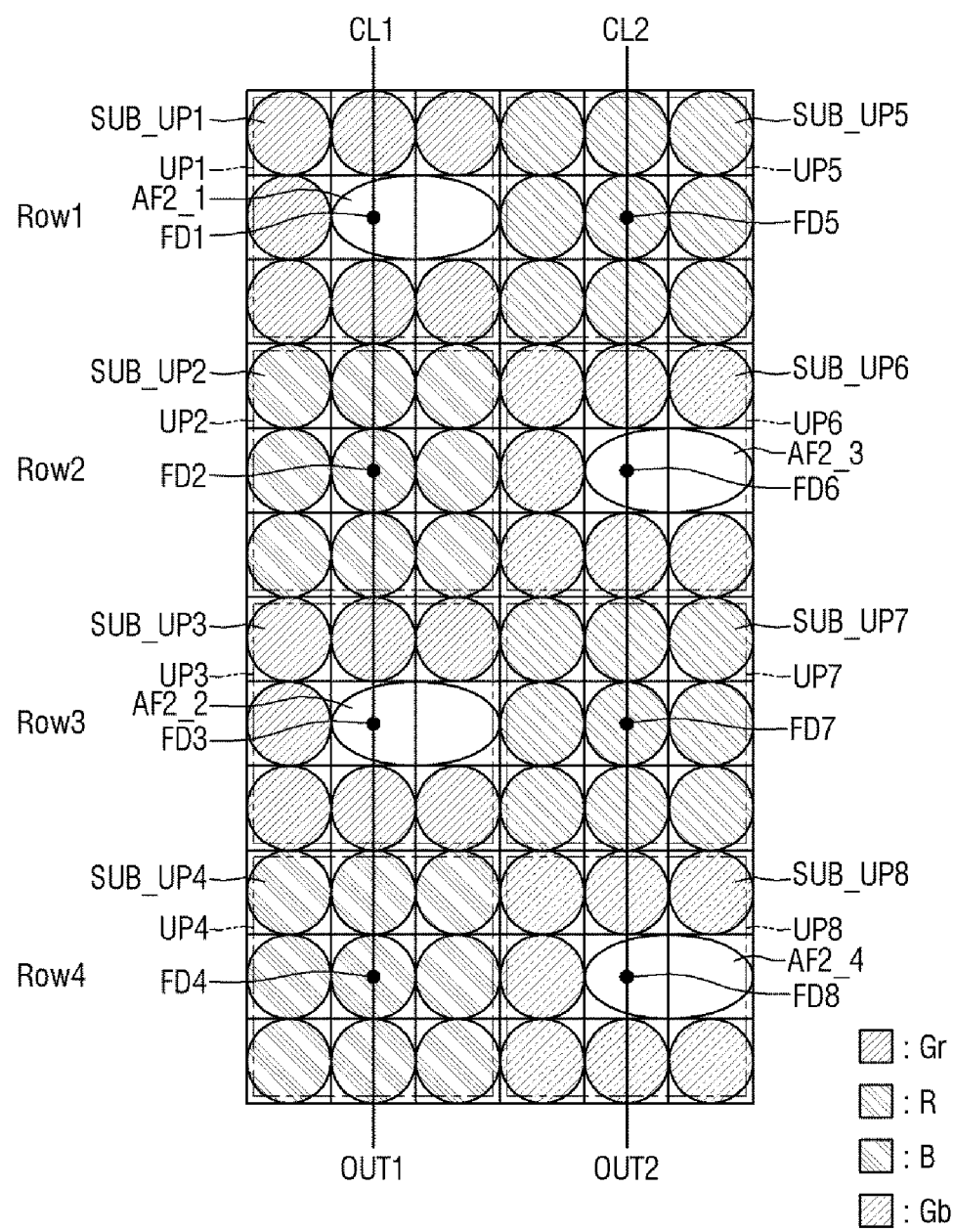

Referring to FIG. 12, some regions UP1, UP3, UP6, and UP8 among the unit pixel regions UP1 to UP8 may include phase detection pixel regions AF2_1, AF2_2, AF2_3, and AF2_4. For example, two regions among the nine sub-pixel regions SUB_UP1 may be the phase detection pixel regions AF2_1. The phase detection pixel regions AF2_1, AF2_2, AF2_3, and AF2_4 included in each of the unit pixel regions UP1 to UP8 may be arranged side by side in the direction of the row lines. The phase detection pixel regions AF2_1, AF2_2, AF2_3, and AF2_4 may be arranged in a zigzag direction with each other. For example, the phase detection pixels included in one phase detection pixel region AF2_1 may be disposed in the same unit pixel region UP1 to detect light of the same color.

Figure 13:
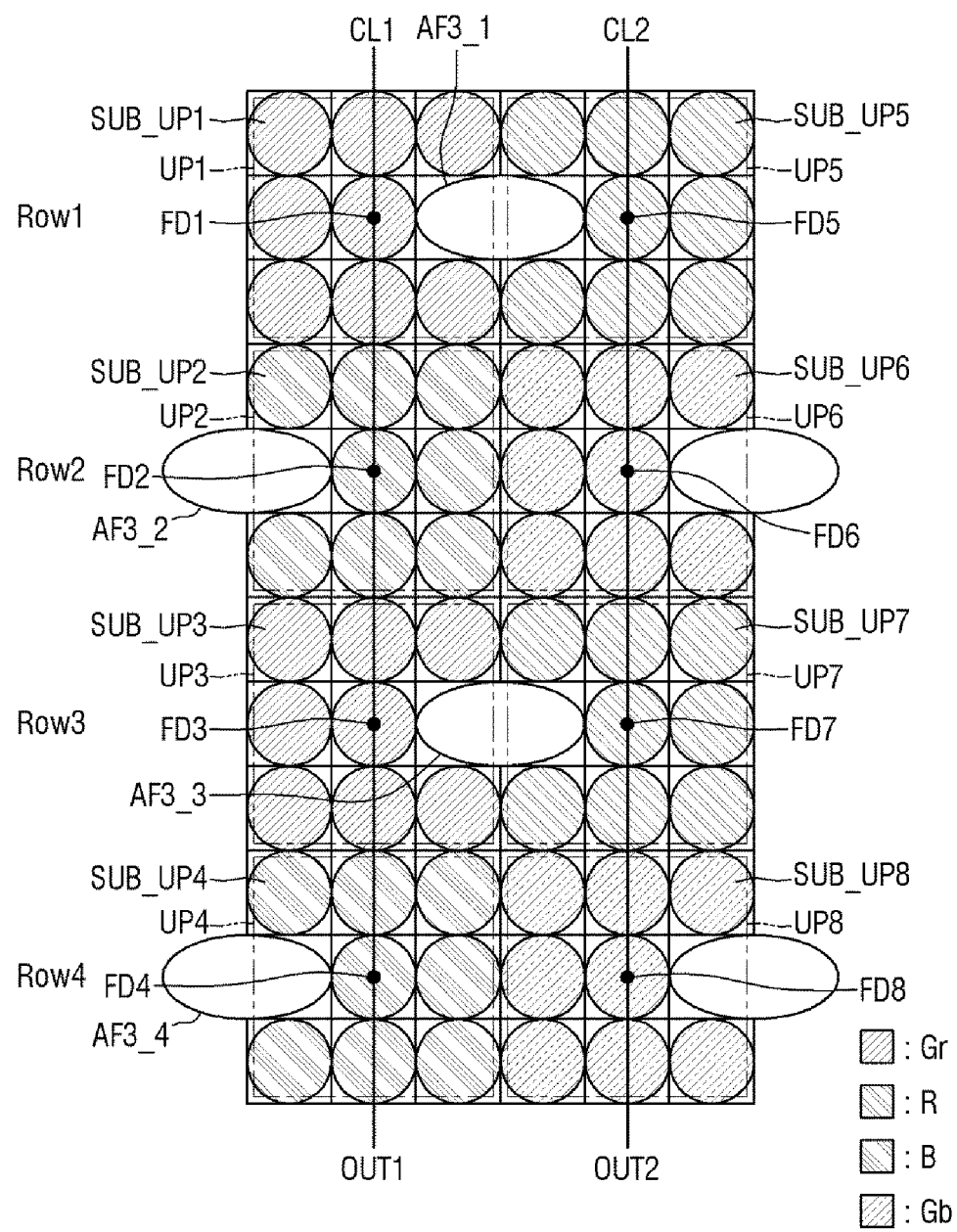

Referring to FIG. 13, the unit pixel regions UP1 to UP8 may include phase detection pixel regions AF3_1, AF3_2, AF3_3, and AF3_4. For example, one region among the nine sub-pixel regions SUB_UP1 may be the phase detection pixel region AF3_1. The phase detection pixel regions AF3_1, AF3_2, AF3_3, and AF3_4 included in each of the unit pixel regions UP1 to UP8 may be arranged side by side in the direction of the row lines. The phase detection pixel regions AF3_1, AF3_2, AF3_3, and AF3_4 may be arranged in a zigzag pattern in relation to one another. For example, the phase detection pixels included in one phase detection pixel region AF3_1 may be disposed in different one of the unit pixel regions UP1 and UP2.

Figure 14:
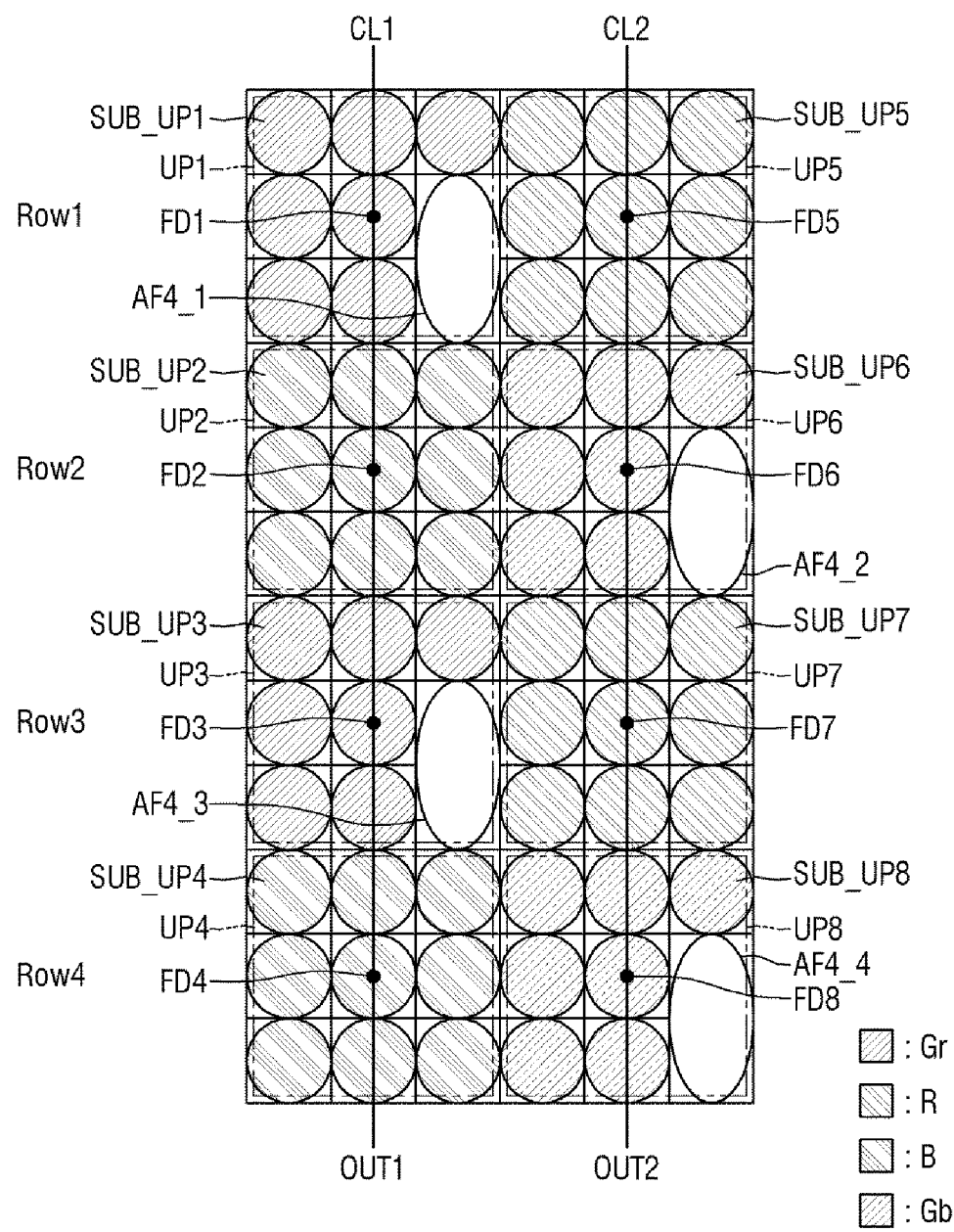

Referring to FIG. 14, phase detection pixel regions AF4_1, AF4_2, AF4_3, and AF4_4 may be included in some regions UP1, UP3, UP6, and UP8 among the unit pixel regions UP1 to UP8. For example, two regions among the nine sub-pixel regions SUB_UP1 may be the phase detection pixel region AF4_1. The phase detection pixel regions AF4_1, AF4_3, AF4_2, and AF4_4 included in each of the unit pixel regions UP1, UP3, UP6, and UP8 may be arranged side by side in the direction of the column lines. The phase detection pixel regions AF4_1, AF4_2, AF4_3, and AF4_4 may be arranged in a zigzag direction with each other. For example, the phase detection pixels included in one phase detection pixel region AF4_1 may be disposed in the same unit pixel region UP1 to detect light of the same color.

Figure 15:
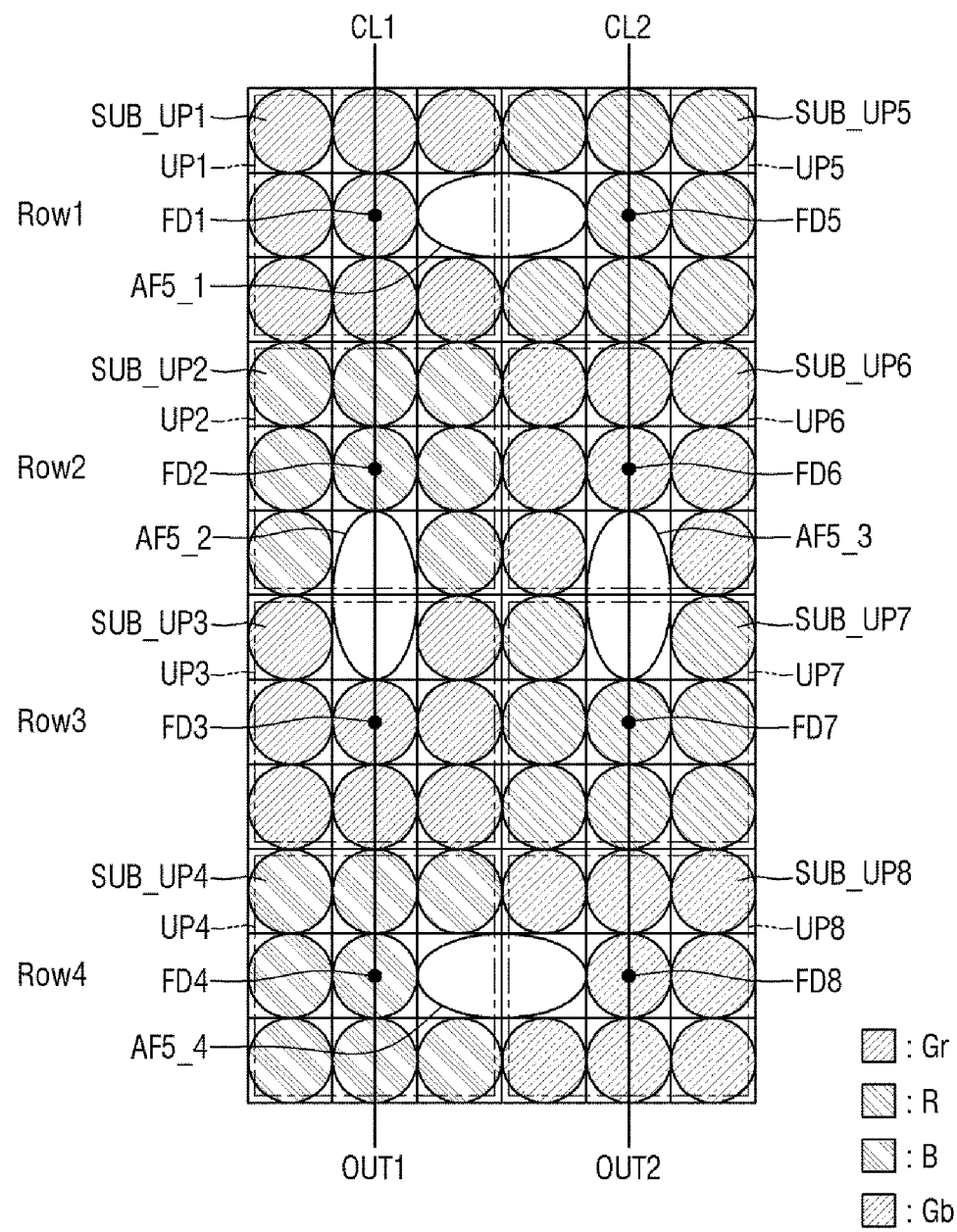

Referring to FIG. 15, the unit pixel regions UP1 to UP8 may include phase detection pixel regions AF5_1, AF5_2, AF5_3, and AF5_4. For example, one region among the nine sub-pixel regions SUB_UP1 may be a phase detection pixel region AF5_1. The phase detection pixel regions AF5_1, AF5_2, AF5_3, and AF5_4 included in each of the unit pixel regions UP1 to UP8 may be arranged side by side in the direction of column lines or in the direction of row lines. For example, the phase detection pixels included in one phase detection pixel region AF5_1 may be disposed in different unit pixel regions UP1 and UP2.

Alternately, arrangement relationship(s) between the readout circuit and the ADC in the embodiments of FIGS. 9 and 10 may be similarly applied to the embodiments of FIGS. 11 to 15. For example, each pixel signal output from the first to eighth unit pixel regions UP1 to UP8 including the phase detection pixel region may each be read to different ADCs.

Those skilled in the art will appreciate that many variations and modifications may be made to the illustrated embodiments without substantially departing from the scope of the inventive concept, as defined by the following claims.

What is claimed is:

1. An image sensor comprising:
a first unit pixel region comprising:
  a first plurality of photodiodes including a first photodiode, a second photodiode, a third photodiode, a fourth photodiode, a fifth photodiode, a sixth photodiode, a seventh photodiode, an eighth photodiode, and a ninth photodiode arranged in a 3×3 matrix;
  a first color filter on the first plurality of photodiodes;
  a first floating diffusion region shared by the first plurality of photodiodes; and
  a first plurality of microlenses including a first microlens, a second microlens, a third microlens, a fourth microlens, a fifth microlens, a sixth microlens, a seventh microlens, an eighth microlens, and a ninth microlens, each of the first microlens, the second microlens, the third microlens, the fourth microlens, the fifth microlens, the sixth microlens, the seventh microlens, the eighth microlens, and the ninth microlens of the first plurality of microlenses is on the first photodiode, the second photodiode, the third photodiode, the fourth photodiode, the fifth photodiode, the sixth photodiode, the seventh photodiode, the eighth photodiode, and the ninth photodiode of the first plurality of photodiodes, respectively; and
a second unit pixel region comprising:
  a second plurality of photodiodes including a first photodiode, a second photodiode, a third photodiode, a fourth photodiode, a fifth photodiode, a sixth photodiode, a seventh photodiode, an eighth photodiode, and a ninth photodiode arranged in the 3×3 matrix;
  a second color filter on the second plurality of photodiodes;
  a second floating diffusion region shared by the second plurality of photodiodes; and
  a second plurality of microlenses including a first microlens, a second microlens, a third microlens, a fourth microlens, a fifth microlens, a sixth microlens, a seventh microlens, an eighth microlens, and a ninth microlens, each of the first microlens, the second microlens, the third microlens, the fourth microlens, the fifth microlens, the sixth microlens, the seventh microlens, the eighth microlens, and the ninth microlens of the second plurality of microlenses is on the first photodiode, the second photodiode, the third photodiode, the fourth photodiode, the fifth photodiode, the sixth photodiode, the seventh photodiode, the eighth photodiode, and the ninth photodiode of the second plurality of photodiodes, respectively,
wherein the first color filter is different from the second color filter, and
wherein the second unit pixel region is disposed directly adjacent to the first unit pixel region in a first direction.

2. The image sensor of claim 1, further comprising:
a first phase detection photodiode; and
a second phase detection photodiode disposed to the first phase detection photodiode in the first direction,
wherein the first and second phase detection photodiodes are disposed under a single microlens.

3. The image sensor of claim 2, wherein the first unit pixel region comprises nine sub-pixel regions arranged in the 3×3 matrix,
wherein the first floating diffusion region is overlapped with a center region of the nine sub-pixel regions of the first unit pixel region in a third direction, and
wherein the third direction is perpendicular to the first direction.

4. The image sensor of claim 3, wherein the second unit pixel region comprises nine sub-pixel regions arranged in the 3×3 matrix,
wherein the second floating diffusion region is overlapped with a center region of the nine sub-pixel regions of the second unit pixel region in the third direction, and
wherein the first floating diffusion region and the second floating diffusion region are arranged in the first direction.

5. The image sensor of claim 4, further comprising:
a source follower transistor configured to connect to the first photodiode, the second photodiode, the third photodiode, the fourth photodiode, the fifth photodiode, the sixth photodiode, the seventh photodiode, the eighth photodiode, and the ninth photodiode of the first plurality of photodiodes; and
a selection transistor configured to connect to the first photodiode, the second photodiode, the third photodiode, the fourth photodiode, the fifth photodiode, the sixth photodiode, the seventh photodiode, the eighth photodiode, and the ninth photodiode of the first plurality of photodiodes.

6. The image sensor of claim 5, wherein the first phase detection photodiode is included in the first plurality of photodiodes and the second phase detection photodiode is included in the second plurality of photodiodes.

7. The image sensor of claim 6, further comprising:
a third unit pixel region comprising:
  a third plurality of photodiodes including a first photodiode, a second photodiode, a third photodiode, a fourth photodiode, a fifth photodiode, a sixth photodiode, a seventh photodiode, an eighth photodiode, and a ninth photodiode arranged in the 3×3 matrix;
  a third color filter on the third plurality of photodiodes;
  a third floating diffusion region shared by the third plurality of photodiodes; and
  a third plurality of microlenses including a first microlens, a second microlens, a third microlens, a fourth microlens, a fifth microlens, a sixth microlens, a seventh microlens, an eighth microlens, and a ninth microlens, each of the first microlens, the second microlens, the third microlens, the fourth microlens, the fifth microlens, the sixth microlens, the seventh microlens, the eighth microlens, and the ninth microlens of the third plurality of microlenses is on the first photodiode, the second photodiode, the third photodiode, the fourth photodiode, the fifth photodiode, the sixth photodiode, the seventh photodiode, the eighth photodiode, and the ninth photodiode of the third plurality of photodiodes, respectively; and a first output line configured to receive first signals generated from the first plurality of photodiodes and second signals generated from the third plurality of photodiodes, and wherein the third unit pixel region is disposed adjacent to the first unit pixel region in a second direction perpendicular to the first direction.

8. The image sensor of claim 7, further comprising:
a fourth unit pixel region comprising:
  a fourth plurality of photodiodes including a first photodiode, a second photodiode, a third photodiode, a fourth photodiode, a fifth photodiode, a sixth photodiode, a seventh photodiode, an eighth photodiode, and a ninth photodiode arranged in the 3×3 matrix;
  a fourth color filter on the fourth plurality of photodiodes;
  a fourth floating diffusion region shared by the fourth plurality of photodiodes; and
  a fourth plurality of microlenses including a first microlens, a second microlens, a third microlens, a fourth microlens, a fifth microlens, a sixth microlens, a seventh microlens, an eighth microlens, and a ninth microlens, each of the first microlens, the second microlens, the third microlens, the fourth microlens, the fifth microlens, the sixth microlens, the seventh microlens, the eighth microlens, and the ninth microlens of the fourth plurality of microlenses is on the first photodiode, the second photodiode, the third photodiode, the fourth photodiode, the fifth photodiode, the sixth photodiode, the seventh photodiode, the eighth photodiode, and the ninth photodiode of the fourth plurality of photodiodes, respectively; and
a second output line configured to receive third signals generated from the fourth plurality of photodiodes,
wherein the fourth unit pixel region is disposed adjacent to the first unit pixel region in the second direction, and
wherein the second output line is different from the first output line.

9. The image sensor of claim 8, wherein the fourth color filter is different from the first color filter.

10. The image sensor of claim 9, further comprising:
a first analog-digital converter configured to receive signals from the first output line; and
a second analog-digital converter configured to receive signals from the second output line.

11. The image sensor of claim 5, wherein the first and second phase detection photodiodes are included in the first plurality of photodiodes.

12. The image sensor of claim 7, wherein the third color filter is the same as the first color filter.

13. An image sensor comprising:
a first unit pixel region comprising:
  a first plurality of photodiodes including a first photodiode, a second photodiode, a third photodiode, a fourth photodiode, a fifth photodiode, and a sixth photodiode arranged in a M×N matrix;
  a first color filter on the first plurality of photodiodes;
  a first floating diffusion region shared by the first plurality of photodiodes; and
  a first plurality of microlenses including a first microlens, a second microlens, a third microlens, a fourth microlens, a fifth microlens, and a sixth microlens, each of the first microlens, the second microlens, the third microlens, the fourth microlens, the fifth microlens, and the sixth microlens of the first plurality of microlenses is on the first photodiode, the second photodiode, the third photodiode, the fourth photodiode, the fifth photodiode, and the sixth photodiode of the first plurality of photodiodes, respectively; and
a second unit pixel region comprising:
  a second plurality of photodiodes including a first photodiode, a second photodiode, a third photodiode, a fourth photodiode, a fifth photodiode, and a sixth photodiode arranged in the M×N matrix;
  a second color filter on the second plurality of photodiodes;
  a second floating diffusion region shared by the second plurality of photodiodes; and
  a second plurality of microlenses including a first microlens, a second microlens, a third microlens, a fourth microlens, a fifth microlens, and a sixth microlens, each of the first microlens, the second microlens, the third microlens, the fourth microlens, the fifth microlens, and the sixth microlens of the second plurality of microlenses is on the first photodiode, the second photodiode, the third photodiode, the fourth photodiode, the fifth photodiode, and the sixth photodiode of the second plurality of photodiodes, respectively,
wherein the first color filter is different from the second color filter,
wherein the second unit pixel region is disposed directly adjacent to the first unit pixel region in a first direction, and
wherein the M and the N are integers.

14. The image sensor of claim 13, further comprising:
a first phase detection photodiode; and
a second phase detection photodiode disposed to the first phase detection photodiode in the first direction,
wherein the first and second phase detection photodiodes are disposed under a single microlens.

15. The image sensor of claim 14, further comprising:
a source follower transistor configured to connect to the first photodiode, the second photodiode, the third photodiode, the fourth photodiode, the fifth photodiode, and the sixth photodiode of the first plurality of photodiodes; and
a selection transistor configured to connect to the first photodiode, the second photodiode, the third photodiode, the fourth photodiode, the fifth photodiode, and the sixth photodiode of the first plurality of photodiodes.

16. The image sensor of claim 15, wherein the first phase detection photodiode is included in the first plurality of photodiodes and the second phase detection photodiode is included in the second plurality of photodiodes.

17. The image sensor of claim 16, further comprising:
a third unit pixel region comprising:
  a third plurality of photodiodes including a first photodiode, a second photodiode, a third photodiode, a fourth photodiode, a fifth photodiode, and a sixth photodiode arranged in the M×N matrix;
  a third color filter on the third plurality of photodiodes;
  a third floating diffusion region shared by the third plurality of photodiodes; and
  a third plurality of microlenses including a first microlens, a second microlens, a third microlens, a fourth microlens, a fifth microlens, and a sixth microlens, each of the first microlens, the second microlens, the third microlens, the fourth microlens, the fifth microlens, and the sixth microlens of the third plurality of microlenses is on the first photodiode, the second photodiode, the third photodiode, the fourth photodiode, the fifth photodiode, and the sixth photodiode of the third plurality of photodiodes, respectively;

a first output line configured to receive first signals generated from the first plurality of photodiodes; and a second output line configured to receive second signals generated from the third plurality of photodiodes, wherein the third unit pixel region is disposed adjacent to the first unit pixel region in a second direction perpendicular to the first direction.

18. The image sensor of claim 17, further comprising:

a fourth unit pixel region comprising:
- a fourth plurality of photodiodes including a first photodiode, a second photodiode, a third photodiode, a fourth photodiode, a fifth photodiode, and a sixth photodiode arranged in the M×N matrix;
- a fourth color filter on the fourth plurality of photodiodes;
- a fourth floating diffusion region shared by the fourth plurality of photodiodes; and
- a fourth plurality of microlenses including a first microlens, a second microlens, a third microlens, a fourth microlens, a fifth microlens, and a sixth microlens, each of the first microlens, the second microlens, the third microlens, the fourth microlens, the fifth microlens, and the sixth microlens of the fourth plurality of microlenses is on the first photodiode, the second photodiode, the third photodiode, the fourth photodiode, the fifth photodiode, and the sixth photodiode of the fourth plurality of photodiodes, respectively; and
- a second output line configured to receive third signals generated from the fourth plurality of photodiodes, wherein the fourth unit pixel region is disposed adjacent to the first unit pixel region in the second direction, and wherein the second output line is different from the first output line.

19. The image sensor of claim 18, wherein the fourth color filter is different from the first color filter.

20. The image sensor of claim 15, wherein the first and second phase detection photodiodes are included in the first plurality of photodiodes.

* * * * *